(12) United States Patent
Goertler et al.

(10) Patent No.: US 6,215,911 B1
(45) Date of Patent: Apr. 10, 2001

(54) METHOD FOR CORRECTING THE INTENSITY OF AN IMAGE

(75) Inventors: Georg Goertler, Baiersdorf; Guenter Schnur, Hemhofen, both of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 08/989,648

(22) Filed: Dec. 12, 1997

(30) Foreign Application Priority Data

Dec. 20, 1996 (DE) .............................................. 196 53 476

(51) Int. Cl.$^7$ ......................................................... G06F 9/40
(52) U.S. Cl. ........................... 382/264; 382/260; 382/274; 382/169
(58) Field of Search ..................................... 382/264, 260, 382/274, 169, 194, 221; 358/434, 436, 438, 466

(56) References Cited

U.S. PATENT DOCUMENTS

| 5,592,571 | * | 1/1997 | Peters | 382/261 |
| 5,715,334 | * | 2/1998 | Peters | 382/254 |

* cited by examiner

*Primary Examiner*—Jerome Grant, II
*Assistant Examiner*—Negussie Worku
(74) *Attorney, Agent, or Firm*—Schiff Hardin & Waite

(57) ABSTRACT

In an image acquisition method in which there is a sensitivity characteristic over the image space that is non-uniform but that changes only slowly, this characteristic is determined according to the steps of, in the original image, intensity changes are limited to a predetermined maximum value, a low-pass filtering is applied to the auxiliary image acquired in this way, and the sensitivity characteristic of the image acquisition method over the image space is acquired from the low-pass-filtered auxiliary image.

11 Claims, 5 Drawing Sheets

METHOD FOR CORRECTING THE INTENSITY OF AN IMAGE

BACKGROUND OF THE INVENTION

1. Field of the Invention

The present invention is directed to a method for correcting the intensity of an image, and in particular to a method for correcting an image produced using an image acquisition system which exhibits a sensitivity characteristic over the image space that is non-uniform and that changes slowly.

2. Description of the Prior Art

European Application 0 238 962 discloses a method for digital image correction wherein non-uniform brightness distribution due to an imaging system is corrected in two steps. First, a gross brightness map is produced, from which correction data are obtained by means of smoothing. For the production of the gross brightness map, two methods are proposed: the summation of all brightness values in predetermined windows, and the use of the highest brightness value for the central image point in a predetermined window.

In many image acquisition methods, there is the problem that during the pickup or exposure process a sensitivity characteristic is present that is non-uniform over the imaging region. For example, the sensitivity can fall off toward the edge of the image, so that occlusions or vignettings occur at the edge of the image. An image acquisition method in which this problem occurs is, for example, nuclear magnetic resonance tomography. As is well known, atomic nuclei are thereby excited in a strong magnetic field by means of radio-frequency irradiation. The RF signal that arises is received with an antenna and is converted into intensity values for an image data matrix composed of individual image points (pixels). For the excitation of the nuclear spins, in most cases what a so-called whole-body antenna is used, which exhibits a relatively good homogeneity in the overall region under examination. So-called local coils or local antennas, which cover only a relatively small region, are often used for the reception of the nuclear magnetic resonance signals that arise. In this way, an improved sensitivity and a better signal/noise ratio are achieved. A special form of such local coils is known as an array coil, which has several receive coils arranged alongside one another, and these being respectively switched to an active receive stage according to the size and shape of the region under examination. An example of such an array coil is shown in FIG. 1. Several overlapping individual coils 1 are thereby provided, which run via matching circuits 2 to a combination network 3, where the total received signal is finally acquired.

In contrast to the whole-body antenna described above, local coils exhibit a relatively non-uniform sensitivity distribution, i.e., the sensitivity is high in the center and falls off toward the edges. This causes occlusions in the edge regions of the acquired image, which are significantly disturbing. In an array coil as described above, there is the additional problem that the image intensity changes according to the activation of the individual coils. Moreover, flexible local coils are known that are applied directly to the body of the patient. The sensitivity characteristic is thereby not initially determinable, but only results after application to the body of the patient.

In existing apparatuses, e.g. of the type Magnetom® of the company Siemens AG, for the avoidance of this problem a method is used that is briefly presented below in order to explain the underlying problem to which the present invention is directed. It is thereby assumed that, for MR imaging, signals whose origin is encoded in phase factors are acquired in a known way. These signals are demodulated in phase-sensitive fashion, are digitized, and are entered in a raw data matrix, generally referred to as a "k-space." By means of two-dimensional or three-dimensional Fourier transformation, from this raw data matrix an image data matrix is obtained that is composed of individual pixels with allocated digital intensity values. Imaging by means of magnetic resonance (MR) is not described in more detail herein, since it is not part of the invention. Rather, reference is made to the book by Morneburg—which gives an overview—entitled: Bildgebung fur die medizinische Diagnostik, $3^{rd}$ edition, 1995, chapter 6.2, "Verfahren zur Ortsauflösung."

In the known method for determining the coil characteristic, it is obtained from the image itself. The correct assumption is made that the coil sensitivity changes only slowly over the image, and thus is expressed in a low-pass-filtered image. Therefore, a strong low-pass filtering of the original image is first carried out, by conducting a two-dimensional Fourier transformation in the row direction and in the column direction in a two-dimensional image. As is well known, by means of the Fourier transformation the image information is converted into the frequency space. In this frequency space, the center corresponds to low frequencies and the edge region corresponds to high frequencies. In the frequency space, a filter is now applied that extracts the central region by filtering. In the simplest case, all values outside a central region, which for example could comprise only 4×4 points in a matrix of 256×256 points, are set to zero. If a two-dimensional inverse Fourier transformation is now applied to the resulting matrix in the frequency space, a return to the image space results, with the auxiliary image acquired in this way being very strongly low-pass filtered in relation to the original image. This auxiliary image is now regarded as the coil characteristic, and is used for the correction of the original image. For this purpose, the auxiliary image is normalized to 1, and in the original image each pixel is multiplied by the reciprocal value of the allocated pixel in the normed auxiliary image. By this procedure, in low-signal regions of the image a very high multiplier could arise, which would, for example, greatly increase the noise. A cutoff is thus predetermined that places an upper limit on the maximum multiplier. This prevents pure noise regions being increased (boosted) to the level of intensity of the rest of the image.

A flow chart of this known method is shown schematically in FIG. 2. Given an array coil, three original images BD are employed, the respective observation windows being designated FOV (Field Of View), as is standard. By means of a two-dimensional Fourier transformation (2D-FFT), datasets in the frequency space are obtained (FD). The designation 2D-FFT comes from the fact that a two-dimensional Fourier transformation is conducted using, the fast Fourier transform (FFT) algorithm. A filter is applied to the datasets FD, which weights the center thereof—which corresponds to low frequencies—more strongly than the edge regions, which represent higher frequencies. By means of a further Fourier transformation, low-pass-filtered auxiliary images $BD_k$ are obtained. Taking into account the above-explained cutoff, which is entered by the user, each pixel from the image dataset BD is now multiplied, so that a corrected image $BD_k$ is obtained.

The effect of this correction is shown in FIGS. 3 to 5. A phantom is thereby imaged that essentially has a rectangular cross-section with two indentations. The continuous line represents the target value of the intensity curve I over the axis x. The sensitivity characteristic of the surface coil used to pick up the signal is shown with thin broken lines in FIG. 3. The intensity curve 1, shown with a thick broken line, is thereby obtained in the image. Only one noise signal occurs outside the region of the phantom Ph. If the acquired image is strongly low-pass-filtered, the intensity curve shown in FIG. 4 with a continuous line is obtained. As explained above, this intensity curve is normed to 1, and from the normed values the reciprocal value is calculated, but only up to a determined cutoff, so that the reciprocal value can never become greater than e.g. 5. The intensity values of the original image (thus, of the intensity curve according to FIG. 3, shown with a thick broken line) are now multiplied by this reciprocal value. The resulting intensity curve is shown in FIG. 5. It can be seen that due to the strong low-pass filtering of the data used for the correction, the edge regions of the imaged object are boosted, whereby in FIG. 5 this boosting is exaggerated somewhat so that it can be seen more clearly. This boosting in the edge regions of the object is particularly disturbing in MR images, since for example in examining the human body fatty tissue is often present at the edge, which already has an undesirably high signal intensity anyway. This signal intensity is increased further if this known method is employed.

SUMMARY OF THE INVENTION

An object of the present invention is to provide a correction method in which the disturbing signal exaggeration at the edge of the subject under examination does not occur.

The above object is achieved in accordance with the principles of the present invention in a method wherein an original image is analyzed in at least one direction for changes in intensity from pixel to pixel, and the intensity value of a pixel which drops off by more than a predetermined value relative to the intensity value of an adjacent pixel is replaced with an intensity value representing a maximum drop-off, thereby obtaining an auxiliary image. The auxiliary image is low-pass filtered, and from the intensity distribution of the low-pass filter auxiliary image, sensitivity values are obtained and allocated to the respective pixels in the image. The intensity values of the respective pixels of the original image are weighted with a value that is a reciprocal of the aforementioned allocated sensitivity value.

The method can be iteratively repeated multiple times, using the corrected image as the original image, thereby continually improving the corrected image.

DESCRIPTION OF THE DRAWINGS

As noted above.

As noted above.

As noted above.

DESCRIPTION OF THE PREFERRED EMBODIMENTS

Figure 4:
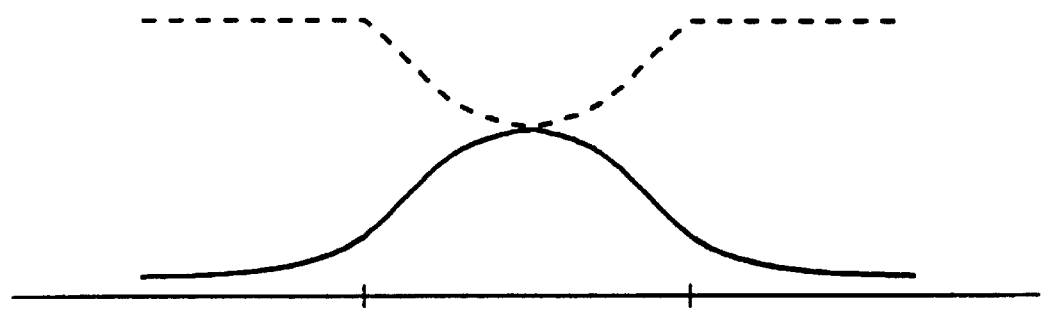
Figure 5:
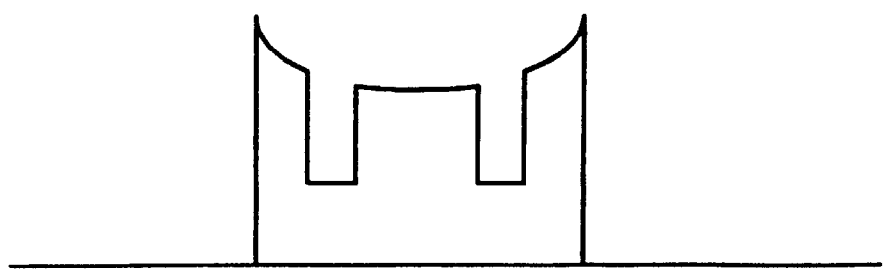

The invention is based on the recognition that for large jumps in intensity in the original image, the low-pass-filtered original image does not correctly reproduce the actual sensitivity curve of the receiving antenna. In FIG. 4, it can be seen that at the jumps in intensity to the left and to the right of the phantom, the low-pass-filtered image falsely depicts a much stronger drop-off of the sensitivity of the receive antenna than is actually the case. Given a real coil characteristic, however, arbitrarily large jumps in intensity cannot occur at all. The problem cited is solved according to the invention in that the original image is manipulated before the low-pass filtering in such a way that only one maximum change in intensity is permitted between two adjacent image points (pixels). In the exemplary embodiment according to FIG. 6, this is realized by virtue of only one maximal drop-off of the signal being permitted from pixel to pixel.

Figure 1:
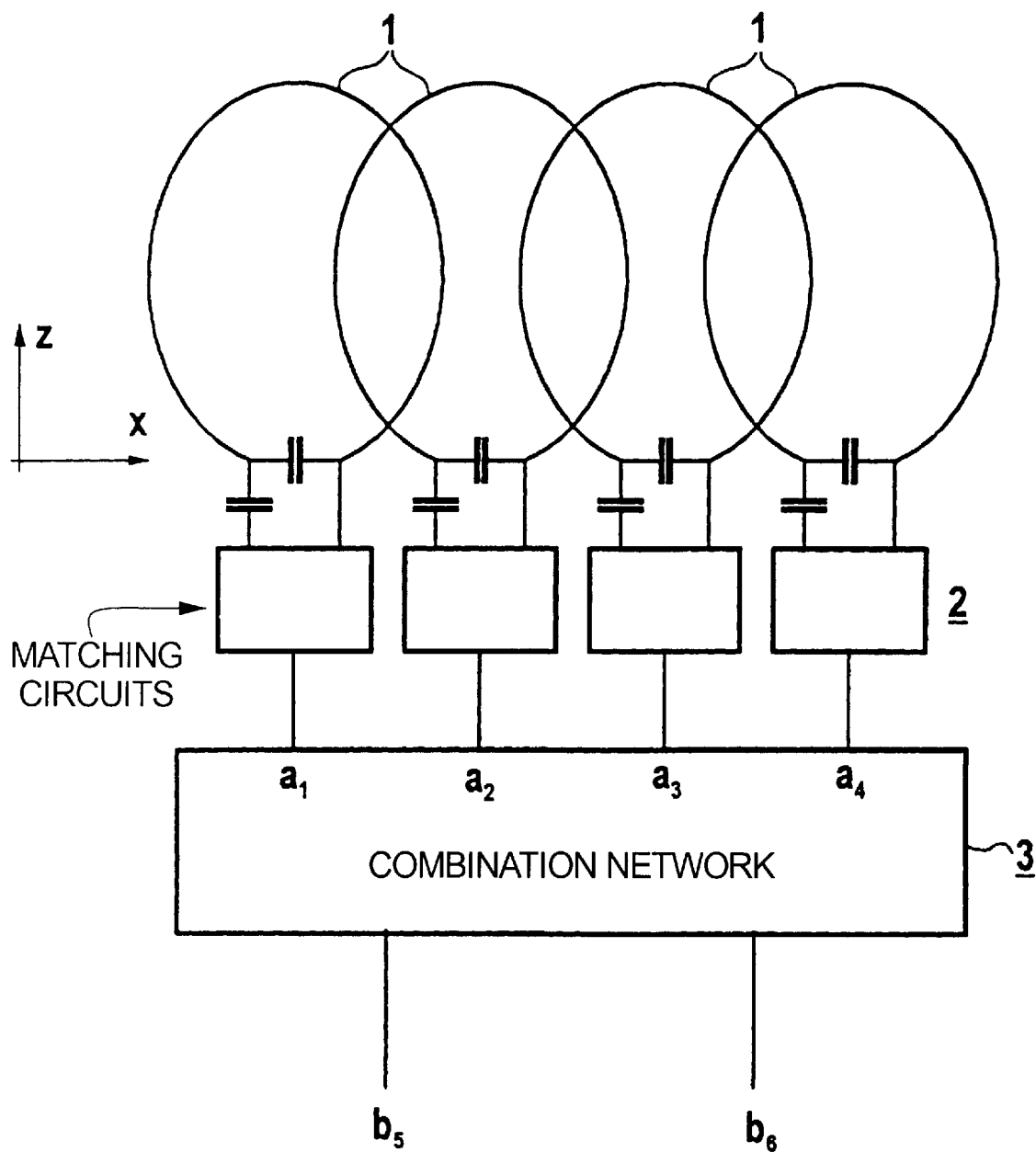
FIG. 1 is a schematic illustration of a known array coil used in magnetic resonance imaging.
Figure 2:
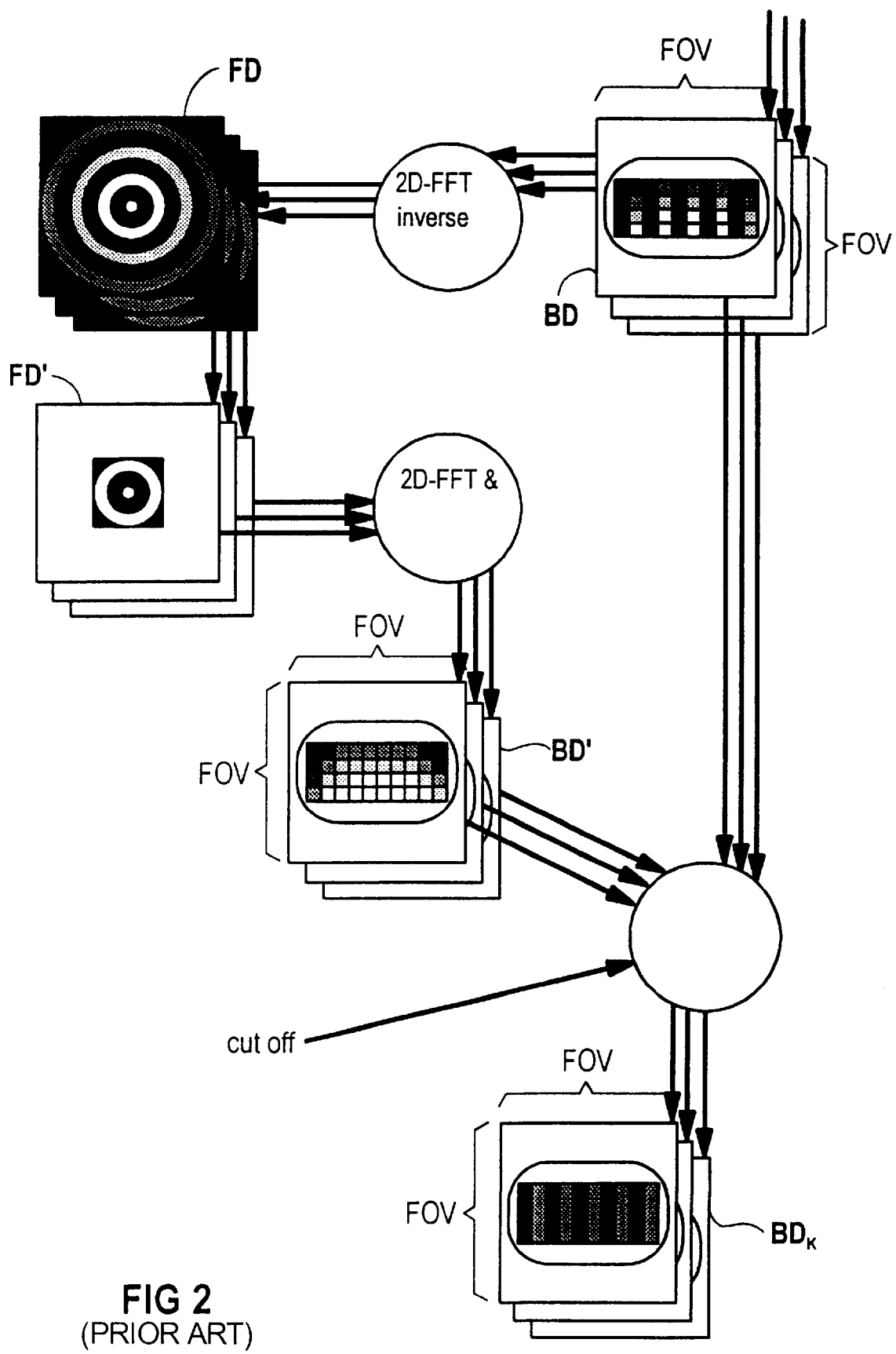
FIG. 2 is a flowchart of a known image correction method employed in magnetic resonance imaging.
Figure 3:
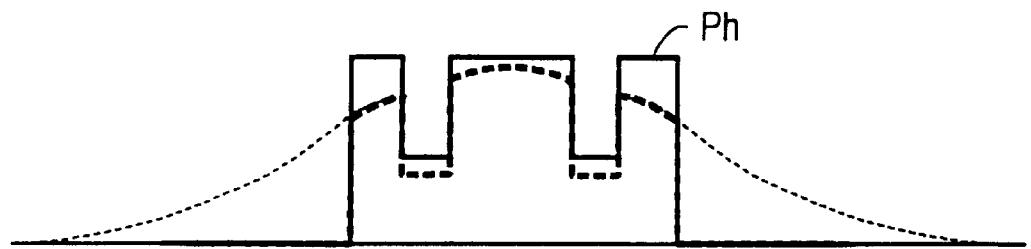
FIGS. 3, 4 and 5 illustrate the effect of the known image correction method illustrated in FIG. 2.
Figure 6:
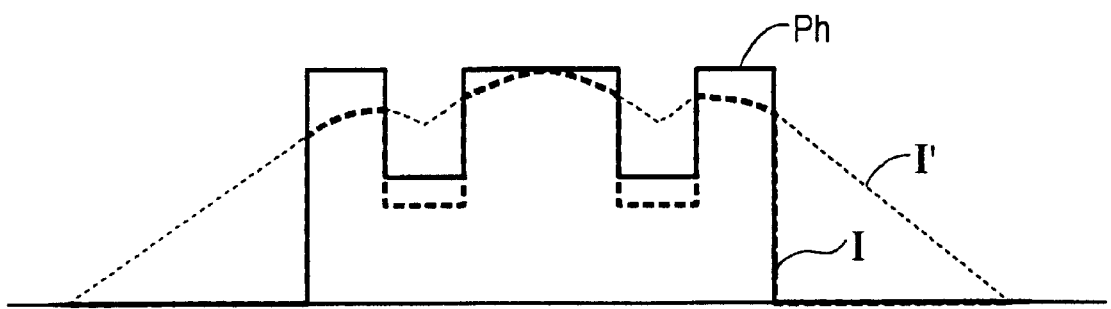
FIG. 6 illustrates the creation of an auxiliary image from the original image, in accordance with the inventive method.

In FIG. 6, as in FIG. 3, the target value of the intensity curve in the x direction for a phantom Ph is shown as a continuous line, and the uncorrected intensity curve I thereby obtained is shown as a thick broken line. For the calculation of the sensitivity characteristic of the receive coil, neither the intensity curve I nor the original image is used directly; rather, an intensity curve I' or an auxiliary image BD' is used. The intensity curve I' is obtained as follows: In a first step, the intensity value $I_n$ of each pixel is compared from left to right in the x direction with the intensity value $I_{n-1}$ of the preceding pixel n−1. If $$I_n - I_{n-1} > \Delta I_{max},$$

the intensity value $I_n$ is replaced with $I'_n$, whereby:

$$I'_n = I_{n-1} - \Delta I_{max}$$

$\Delta I_{max}$ is thereby a fixedly set value in an exemplary embodiment.

Figure 7:
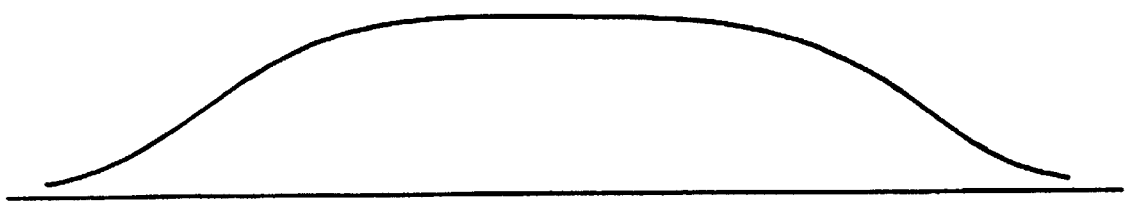
FIG. 7 illustrates the intensity curve thereby obtained from low-pass filtering, in accordance with the inventive method.

This process is now repeated in the x direction from right to left. In addition, the same process is applied in the y direction, so that finally an auxiliary image or an auxiliary dataset, BD' is obtained. This auxiliary dataset BD' is now low-pass-filtered by carrying out a Fourier transformation in the way described above. In principle, a simple average value formation over adjacent image points could be carried out for this purpose. Since, however, an FFT computer is provided anyway for the image reconstruction, it is generally more elegant to realize the low-pass filtering by means of an FFT as well. For this purpose, an FFT is carried out on the auxiliary dataset BD'. From the image space, one thus moves to the frequency space, where rapid changes in intensity in the image correspond to high frequencies. In the dataset obtained in this way, the center represents low frequencies and the edges represent high frequencies. In principle, one could thus acquire the low frequencies by cutting out the center in this dataset, or by setting all values outside the center to zero. In practice, however, it is necessary to ensure that there is a smooth transition to the points which have been set to zero. For this purpose, a filtering by means of multiplication of the dataset by a cosine-shaped function has proven reliable, the cosine-shaped function assuming values from one to zero proceeding from the center outwardly in the column and row direction. The width of the filter corresponds to half the matrix segment. By means of back-transformation into the image space, a low-pass-filtered auxiliary image BD'', or a low-pass-filtered auxiliary dataset, is obtained. This dataset exhibits, for example, the intensity curve shown in FIG. 7 in the x direction. As in the known method, this curve is normed to 1, and the respectively allocated pixels of the original image are weighted with a reciprocal value. As is shown by a comparison of FIGS. 4 and 7 in FIG. 7, the low-pass-filtered image data fall off less at the edges of the phantom Ph, due to the limitation of the signal drop-off in the underlying auxiliary image. This corresponds better to the real conditions of the sensitivity characteristic of the surface coil, and has the result that the edge exaggeration is avoided, or at least significantly reduced. In the following, methods are described with which additional improvements can be achieved in the determination of the sensitivity characteristic.

A problem with the method as generally presented above is that disturbances in individual image points, known as "spikes," in the original image can have a strong effect on the adjacent pixels, since these are also boosted in the method described above. In the subsequent low-pass filtering, individual spikes thus stand out much more strongly than without the described limitation of the drop-off in intensity. In MR apparatuses, for example, an offset leads to a strong increase in the intensity of the central image point, and thereby to the problem described above. Offset artifacts of this sort can also expand over a column or over a row of the image data matrix.

In an improved inventive method, a spike elimination is thus carried out before the auxiliary dataset is acquired. In the simplest case, for all rows and columns of the original image dataset, the intensity of each pixel is compared with the intensity of the adjacent pixels in the row direction and in the column direction. If a local maximum is found that has a difference greater than a predetermined value $\Delta I_{smax}$ at both sides (intensity value of the preceding and following pixel), the intensity value of the pixel in question is replaced by an intensity value that results from the average between the intensity values of the preceding and subsequent pixel, plus the maximum allowable change in intensity $\Delta I_{smax}$. Local maxima are thereby eliminated. This holds both for individual image points and for individual rows and columns. Such intensity exaggerations thus no longer have a disturbing effect on the further processing.

After this spike elimination, there follows the step (described above on the basis of FIG. 6) of limitation of the drop-off in intensity, as well as the further steps for acquiring the coil characteristic.

In a further improvement of the method, the following effect is taken into account. The drop-off in intensity in the original image due to the coil characteristic has an effect, according to the coil position, not only in the row and column directions of the original data matrix, but in all directions. If the above-described limitation of the drop-off in intensity is thus carried out only row-by-row and column-by-column, a drop-off in intensity that is greater than was predetermined nonetheless still can be present in the direction of the image diagonals. In an expansion of the inventive method presented above, the drop-off in intensity is thus limited not only in the row and column directions (x, y directions), but also in the direction of the diagonals of the original image matrix. If a drop-off in intensity of $\Delta I_{max}$ is thereby permitted in the row and column directions, a drop-off in intensity of $$\Delta I_{maxD} = \Delta I_{max} \cdot \sqrt{\sqrt{2}}$$

is thus permitted in the diagonal direction.

With the method specified so far, the edge effects caused by the lowpass are largely eliminated. There is still the problem that, in the corrected image, regions that are weak in intensity are boosted excessively in relation to regions with strong intensity. This effect is due to the fact that the drop-off in image intensity caused by the coil characteristic is non-linear. By means of the application of a constant allowed modification $\Delta I_{max}$, the limitation method thus acts on the original dataset in regions of high image intensity due to the coil more often than in regions of lower image intensity due to the coil. In the subsequent low-pass filtering, the relative difference between high-intensity and low-intensity regions thus increases. Since the reciprocal value of the low-pass-filtered data is used for the intensity correction, low-intensity regions are boosted more strongly than is desired.

By means of the following improvement of the method, this problem is also solved. The allowable change $\Delta I_{max}$ or $\Delta I_{maxD}$ between two successive data points is not chosen to be the same, as an absolute cutoff for all image points, but rather is normed to the intensity that applied respectively for the image point in question. Thus, given high intensity of an image point, a larger drop-off to the adjacent image point is allowed than is allowed given a low intensity of the image point. This is taken into account both in the limitation of the intensity drop-off in the row and column directions and in the diagonal direction. In spike elimination as well, the maximum allowable change in intensity to the adjacent image points is made dependent on the intensity of these image points, i.e., a greater intensity also means a greater allowable change. The intensity of lower-intensity regions is thus also correctly evaluated.

The method described above is again shown schematically in FIG. 8 on the basis of a block diagram.

In the specific case of MR imaging, an image dataset BD (image data matrix) is obtained from a raw dataset RD (raw data matrix) by means of inverse two-dimensional Fourier transformation FFT. In other imaging methods, the image dataset BD can be produced in any other way. From the image dataset BD, an auxiliary dataset BD' is obtained by means of the specified spike elimination and a subsequent limitation of the maximum drop-off. This auxiliary dataset is low-pass-filtered, preferably by first carrying out a Fourier transformation FFT. From the thus obtained image dataset $BD'_f$, the central region in the frequency range, which is allocated to the low frequencies, is now weighted more strongly than the edge region, by means of filtering.

From the auxiliary dataset $BD'_f$ in the frequency range a low-pass-filtered dataset BD" is obtained by inverse Fourier transformation $\overline{FFT}$.

The low-pass-filtered dataset BD" is normed to 1, and for each image point the reciprocal value is formed. Finally, in the original dataset BD each image point is multiplied by the reciprocal value that is obtained in this way and that is allocated to it, so that a corrected image dataset $BD_k$ is obtained. The described method can also be used recursively, i.e., for further correction the method is applied again to the corrected image $BD_k$. In other words, the corrected image $BD_k$ is used as the initial dataset in place of the original image BD, e.g. in a second correction step. This can be repeated multiple times. By this procedure, it is possible to determine a smaller value for the allowed change $\Delta I_{max}$ than in a one-iteration method, without losing the information concerning the sensitivity characteristic.

Figure 8:
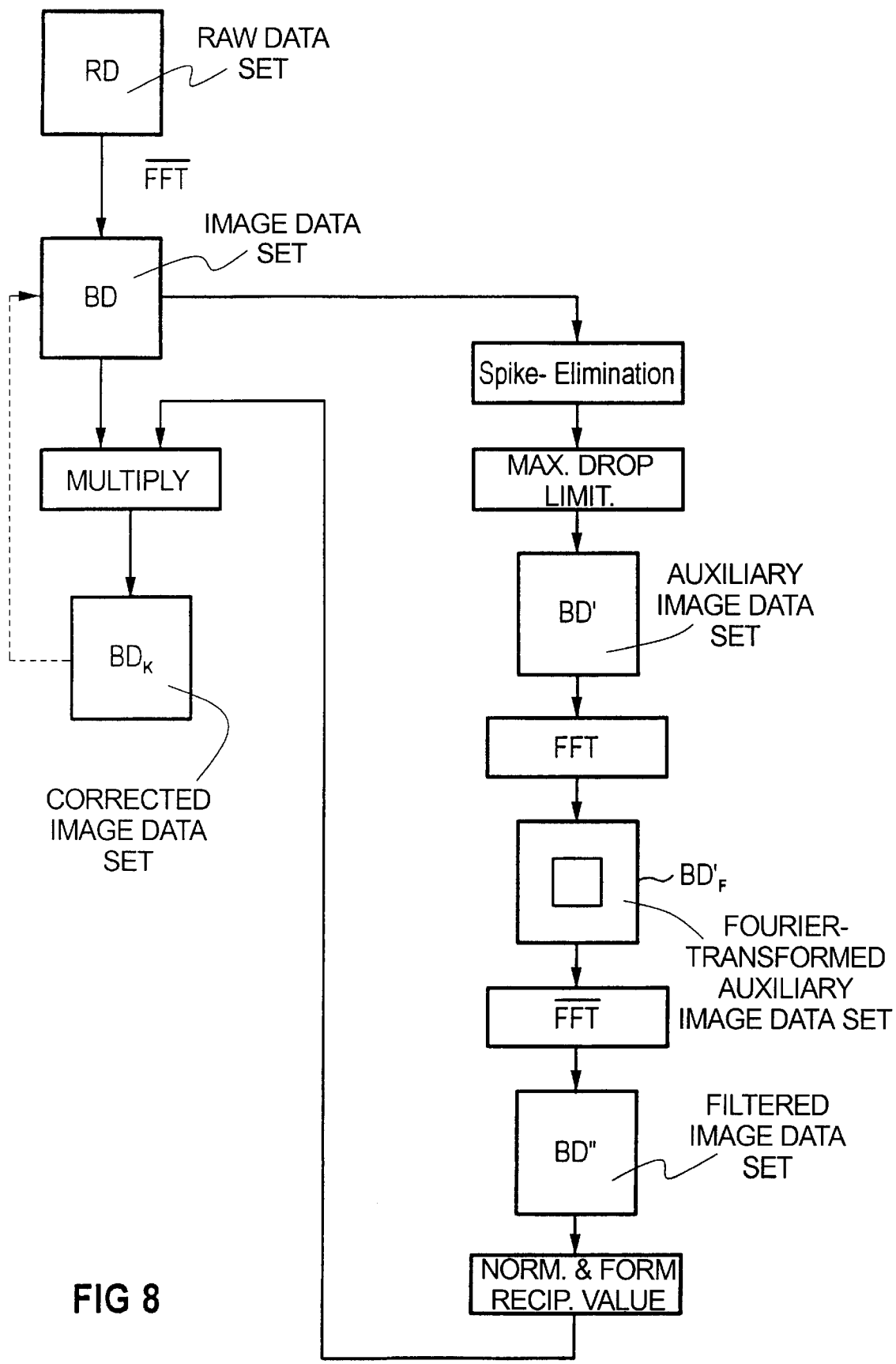
FIG. 8 illustrates a flow chart of the inventive correction method.

In FIG. 8, the recursive (iterative) sequence is represented by means of a dashed line.

The inventive method for correcting image data has been explained essentially in relation to MR imaging. It should be emphasized, however, that the inventive corrective method can be applied to any image acquisition method in which there is a data pickup sensitivity over the image region that is non-uniform and changes only slowly.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for correcting an original image composed of a plurality of pixels in rows and columns which is produced with an image acquisition method having a sensitivity characteristic which varies over the image in a non-uniform slowly changing manner, said method comprising the steps of:

(a) analyzing said original image in at least one direction for changes in pixel intensity from pixel to pixel by comparing, for each pixel in said original image, an intensity of a pixel under analysis with an intensity of an adjacent pixel and, for any pixel under analysis which has an intensity which is greater, by more than a predetermined value, than an intensity of the adjacent pixel, replacing the intensity of said pixel under analysis with an intensity value formed from the intensity of the adjacent pixel and the predetermined value, and thereby obtaining an auxiliary image;

(b) low-pass filtering said auxiliary image to obtain a low-pass filtered auxiliary image having an intensity distribution associated therewith.

(c) from said intensity distribution of said low-pass filtered auxiliary image, assigning sensitivity values respectively to the pixels of said low-pass filtered auxiliary image; and (d) weighting the intensities of the respective pixels in said original image with a value which is a reciprocal of the assigned sensitivity value for a corresponding pixel in said lowpass filtered auxiliary image, and thereby obtaining a corrected image.

2. A method as claimed in claim 1 comprising the additional step of:

repeating steps (a) through (d) N times and, in each repetition, using the corrected image obtained in step (d) as the original image in step (a) of an immediately following repetition.

3. A method as claimed in claim 1 wherein step (a) comprises analyzing said original image in two respectively perpendicular directions.

4. A method as claimed in claim 3 wherein step (a) additionally comprises analyzing said original image in at least one direction which is diagonal to said two respectively perpendicular directions.

5. A method as claimed in claim 1 wherein step (a) comprises for each pixel, assigning a positive direction along said at least one direction and assigning a negative direction, opposite to said positive direction, along said at least one direction, and analyzing each pixel in each of said positive and negative directions.

6. A method as claimed in claim 1 comprising the additional step of identifying a reference pixel and determining said maximum intensity decrease relative to said reference pixel.

7. A method as claimed in claim 1 wherein step (d) comprises weighting said intensities of said original image with respective weightings which are limited by a predetermined limit value.

8. A method as claimed in claim 1 comprising the additional step (before step (a)) of:

analyzing said original image for a presence of at least one pair of adjacent pixels having respective intensities exhibiting a change exceeding a predetermined threshold value in comparison to intensities of a plurality of adjacent pixels, and replacing the respective intensities of said pixels in said pair of adjacent pixels with intensities derived from the respective intensities of said adjacent pixels.

9. A method as claimed in claim 1 wherein step (b) comprises conducting a multi-dimensional Fourier transformation of said auxiliary image to obtain a Fourier-transformed auxiliary image having a central region corresponding to low frequencies, and edge regions;

weighting pixels of said Fourier-transformed auxiliary image in said central region more strongly than pixels in said edge regions to obtain a weighted Fourier-transformed auxiliary image; and low-pass filtering said weighted Fourier-transformed auxiliary image by inverse Fourier transformation.

10. A method as claimed in claim 9 wherein the step of weighting the pixels of said Fourier-transformed auxiliary image comprises applying a cosine function to said Fourier-transformed auxiliary image.

11. A method as claimed in claim 1 comprising the additional step, preceding step (a) of obtaining said original image by conducting a magnetic resonance measurement of a subject to obtain a digital dataset comprising said original image.

* * * * *